United States Patent [19]

Krech

[11] 4,260,673

[45] Apr. 7, 1981

[54] SINGLE SHEET COLOR PROOFING SYSTEM

[75] Inventor: Roger I. Krech, St. Paul, Minn.

[73] Assignee: Minnesota Mining and Manufacturing Company, St. Paul, Minn.

[21] Appl. No.: 72,634

[22] Filed: Sep. 5, 1979

[51] Int. Cl.³ .................................................. G03C 1/52
[52] U.S. Cl. ...................................... 430/143; 430/156; 430/166
[58] Field of Search ........................... 430/143, 156, 166

[56] References Cited

U.S. PATENT DOCUMENTS

| | | | |
|---|---|---|---|
| 2,993,788 | 7/1961 | Straw et al. | 430/143 |
| 3,046,120 | 7/1962 | Schmidt et al. | 430/190 |
| 3,136,637 | 6/1964 | Larson | 430/162 |
| 3,326,682 | 6/1967 | Endermann et al. | 430/143 |
| 3,479,182 | 11/1969 | Chu | 430/156 |
| 3,607,264 | 9/1971 | Celeste | 430/254 |
| 3,649,268 | 3/1972 | Chu et al. | 430/291 |
| 3,671,236 | 6/1972 | Beusekom | 430/143 |
| 3,681,074 | 8/1972 | Poot | 430/143 |
| 3,764,318 | 10/1973 | Laridon | 430/143 |
| 3,782,951 | 1/1974 | Lee | 430/278 |

FOREIGN PATENT DOCUMENTS

| | | | |
|---|---|---|---|
| 1330932 | 9/1973 | United Kingdom | 430/190 |
| 1546753 | 5/1979 | United Kingdom | 430/156 |

Primary Examiner—Won H. Louie, Jr.
Attorney, Agent, or Firm—Cruzan Alexander; Donald M. Sell; Jennie L. Giese

[57] ABSTRACT

A presensitized color proofing sheet and method of obtaining an image on one substrate is disclosed herein. The color proofing sheet is comprised of a color layer, a binder layer, both being light sensitive, and non-light sensitive solvent resistant barrier layer with the binder layer being present to provide a means of eliminating residual toning between adjacent layers in the structure.

5 Claims, 4 Drawing Figures

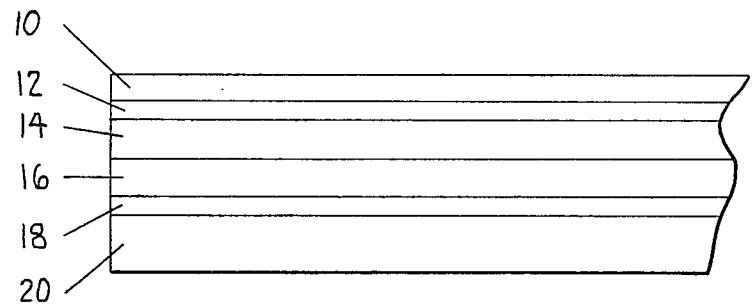
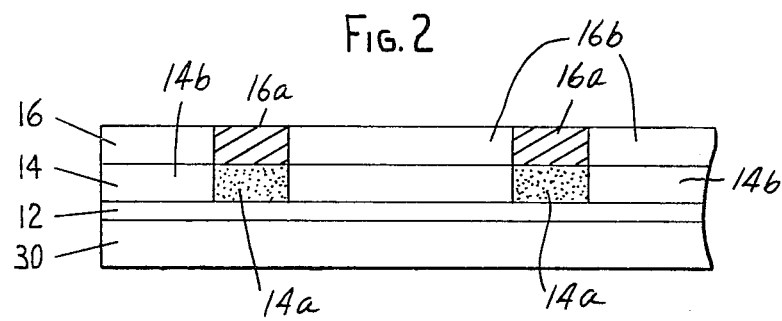
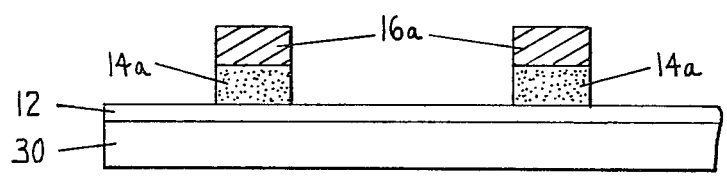
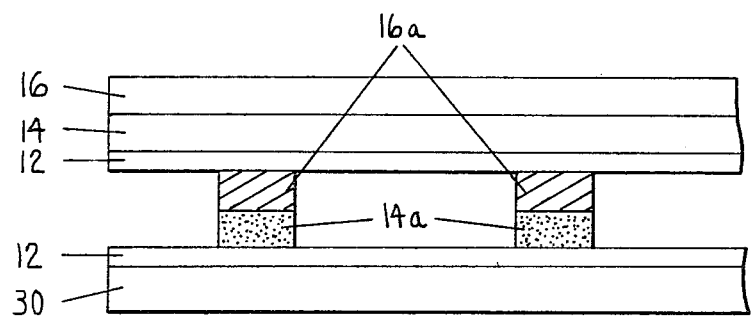

SINGLE SHEET COLOR PROOFING SYSTEM

BACKGROUND OF THE INVENTION

1. Field of the Invention

This invention relates to actinic radiation-sensitive elements for colored image reproduction and more particularly to elements wherein positive images are formed for the purposes of proofing the color separations of original, multi-colored, renditions of graphic art.

2. Description of the Prior Art

In the photomechanical process of reproducing the tone values and color shades represented by a piece of original graphic art, it is necessary to prepare a series of color separations by photographic means so that the particular colors to be printed are first recorded on a set of separation negatives or postives by means of appropriate filtering and masking techniques.

By following known procedures, four photographic black and white separation negative or positives are made representing the three process colors, magenta, cyan and yellow as well as the fourth representing the black contribution. These separations are then used to make four printing plates. These plates are then mounted on an offset printing press to recreate a rendition of the original piece of art.

In some instances, the printing press is not faithful in its reproduction of the copy carried by the printing plates because of inherent limitations in the printing process. In other instances, the buyer of the printed copy may desire changes in tonal values so that the printed matter as represented by the output of the press is more satisfying to his customers. For these reasons and others, a method of previewing the results before actually printing the subject matter has been devised whereby the changes and adjustments may be made to the separation transparencies prior to the manufacture of the printing plates.

One method of previewing the color separation of an original colored pieces of art work is disclosed in U.S. Pat. No. 3,136,637. This patent discloses the use of a multiple layered negative acting proofing system. In this system each of the colored sheets which have been exposed with the appropriate separation negative are developed and then superimposed one on top of the other in exact register. These transparent sheets containing the colored images in exact detail can then be examined individually or in total to recognize any deficiencies compared to the original piece of graphic art prior to the manufacture of the printing plates.

In U.S. Pat. No. 3,671,236, the same objective as above is attained by superimposing on a single substrate the several colored layers so that the composite structure more closely resembles the final printed specimen. This process is again a negative acting system wherein a litographic negative is the means whereby the information is transferred photomechanically to the colored proofing sheets.

Still another proofing system is disclosed in U.S. Pat. No. 2,993,788 wherein a lithographic negative is used to expose a positive acting diazo oxide sensitized substrate. By exposing, developing and the application of a dye of predetermined color using the non-exposed portions of the diazo oxide as a photomask, a single sheet, negative acting proofing composition is attained.

In an examination of the referenced methods of generating color proofs from either positive or negative separations, a common problem is always cited. Namely, that of preserving the background or non-imaged portions of the proof from unwanted staining or discoloration (i.e. toning), which degrades the overall value of the composite proof.

The present invention relates to a presensitized sheet material and an associated proofing method which substantially eliminates such discoloration in the proofing sheet.

SUMMARY OF THE INVENTION

The presensitized color proofing sheet of the present invention is comprised of a carrier sheet having a smooth release surface. Coated onto the release surface of the carrier sheet in a clinging engagement is a color coating of a mixture of a diazo oxide and a pigmented base soluble resin compound. By clinging engagement it is meant that the release value is between 2–60 grams per 2 lineal inches, with between 4 to 20 being preferred, as tested by the procedures described in TAPPI (Technical Association for the Pulp and Paper Industry), vol. 43, No. 8, pp. 164A and 165A (August 1960).

Bonded to the top of this color coating is a discrete binder layer of a mixture of a base soluble resin and a diazo oxide. Both the binder layer and the color coating are solubilizable in a solvent developing medium upon exposure to actinic radiation but not solubilizable in the developing medium prior to exposure to actinic radiation. Firmly attached to the binder is a clear barrier layer which is insolubilizable in the development medium.

In order to obtain a multi-colored color proofing sheet on one substrate, the barrier layer of a first presensitized sheet of the aforementioned construction is bonded to a substrate and the carrier sheet removed. The substrate with the presensitized proofing sheet bonded thereto is then exposed to actinic radiation through a color separation positive corresponding to the pigment of the color coating. The exposed diazo oxide and resin mixture in the binder layer and the color coating is rendered soluble to a solvent developing medium to create a latent image.

The latent image may then be developed with a solvent developing medium whereby the exposed diazo oxide and resin mixture in the binder layer and associated color coating is removed leaving the unexposed diazo oxide and resin. By this removal of the exposed binder layer, the pigment normally associated with causing background discoloration which would have remained bonded to the clear barrier layer is removed.

The aforementioned process is repeated in sequence and in register so that the composite proof contains colored layers representing the magenta, cyan, yellow and black contributions of the original subject matter.

It will be recognized by one skilled in the art that those colored portions of each of the overlying layers remaining on the sheet after development still remain light sensitive and should developing liquids come in contact with these sections representing the imaged sheet, after having been exposed the ambient light, that they too would be removed, thus destroying the structure's use as a proofing system. In the present invention, the solvent resistant barrier layer composed as part of the subsequent presensitized sheet to be imaged, provides protection for the already imaged and developed presensitized sheet laid down previously on the substrate.

DESCRIPTION OF THE PREFERRED EMBODIMENTS

The manner in which this invention functions will become apparent from reference to the drawing and to the specific examples which follow.

FIG. 1 shows a broken away edge view of a photosensitive color proofing sheet.

FIG. 2, likewise, a broken away edge view, shows the structure having been laminated to a substrate after removing the temporary carrier sheet and having been exposed to actinic radiation through a positive acting lithographic film.

FIG. 3 shows the non-exposed portions of the colored proofing film remaining intact whereas, the actinically exposed portions have been removed by a solvent development medium.

FIG. 4 is intended to show a second colored layer of a presensitized proofing sheet in place over the previously developed color layer just prior to bonding and exposure of the second color proofing sheet.

Referring to FIG. 1, a carrier sheet 20 is provided with a release surface 18 which may either be a smooth surface of the carrier itself or a surface coating thereon. The function of release surface 18 is to serve as a parting layer between the carrier sheet 20 and the color layer 16. Carrier sheet 20 may be made of numerous materials which are known in the art. The preferred material for use in the present invention is a 0.002 inch (2 mil) thick polyester film which has a release surface 18 consisting of a coating of a methyl ether of cellulose, e.g, Methocel A-15 sold by Dow Chemical of Midland, Mich.

Color layer 16 is composed of a light sensitive, positive acting diazo oxide dispersed in a solvent soluble resinous binder system in which a pigment representing one of the process colors used in the printing of four color lithography has been dispersed.

Overlying color layer 16 is a continuous binder layer 14 of resin and a diazo oxide mixture or reaction product whose function is to provide for clean release of color layer 16. By maintaining discrete binder and color layers toning is eliminated because the binder layer is free of color pigment. As a result when binder layer 14 is exposed through a positive transparency and developed out simultaneously with color layer 16, it effectively removes any background staining or residual color which otherwise would have been attached to the clear barrier layer 12. Binder layer 14, in its non-exposed state, is a clear film containing little or no optical haze and so does not detract from the color remaining in the imaged area. It is preferred that the diazo oxide used in color layer 16 and binder layer 14 be selected from the group of orthoquinone diazides. The preferred orthoquinone diazide for use in the present invention is the naphthoquinone-(1,2)-diazido-(2)-5-sulfo-acid ester of 4-tertiary butylphenol.

Binder layer 14 is coated from a solvent system that will minimize the penetration of the resinous binder layer 14 into the color layer 16. The ultimate selection of the solvent system is greatly influenced by the drying conditions which will be utilized. It has been found that solvent such as the lower molecular weight alcohols, e.g., methanol, ethanol, n-propyl and isopropyl alcohol, are satisfactory in most cases.

Because of the acidic nature of the diazo oxides after exposure to actinic radiation, an aqueous alkaline developer is required to bring forth the latent image. So as to facilitate the activity of the developer, the resins used in dried layers 14 and 16 should be only slightly penetrable by the aqueous alkaline developer. Examples of such resins are the phenol-formaldehyde novalak resins and other similar resins with sufficient carboxy or hydroxy functionality to allow for penetration by an aqueous base.

Alternatively binder layer 14 may be the reaction product of an alkali-solution of a phenol formaldehyde resin (e.g., Reinox available from Monsanto of St. Louis, Mo.) and 2-diazo-1-naphthol-5-sulfonyl chloride. The reaction product has been found to give a greater latitude in the choice of developers because of its resistance to attack. Further the reaction product has been found to have greater resistance to solvents used for coating the barrier layer 12 which enables binder layer 14 to retain a discrete character.

Adhered to binder layer 14 is a solvent barrier layer 12, whose function is to bond the exposed and developed structure to a permanent base, as well as to protect the image areas of the first laid down color from subsequent development by solvent when the second, third and fourth colors are positioned in place and in register. Because the positive acting diazo oxide containing image portions of a particular color coating 16 and binder layer 14 are still light sensitive after subtracting away the exposed portions, barrier layer 12 acts to protect previously formed image(s) from deterioriation due to developer solvent penetration.

Barrier layer 12 is comprised of a thermally activated adhesive which is coated on the top surface of the binder layer 14. Alternately a pressure sensitive adhesive may be used by bonding it directly to an already coated resin having the solubility characteristics of the thermally activated adhesive. The adhesive is preferably a thermally activated type, i.e. methyl methacrylate, n-butyl methacrylate, n-butyl/isobutyl methacrylate, polyvinyl acetals and polystyrenes. Latices may also be used but due to the presence of the emulsifiers there may be a tendency to attack color layer, so special care in the selection must be taken. The aforementioned resins may be coated from solutions wherein the solvents are straight chain hydrocarbons ($C_2$ to $C_6$) as well as saturated and aromatic cyclic hydrocarbons, e.g. cyclohexane, toluene, etc. Alternatively the adhesive may be moisture sensitive or pressure sensitive e.g. U.S. Pat. No. 3,671,236. The adhesive surface of the barrier layer 12 may be protected from contamination by dirt or grease, by a protective release liner 10 made of materials such as silicone coated paper and the like.

In applying the structure represented by FIG. 1 to a permanent substrate 30, the release liner 10 is removed and the remaining composition is inverted from the position that is shown in FIG. 1 so that barrier layer 12 is placed in contact with the substrate 30 and the two bonded together (FIG. 2). A suitable paper for substrate 30 is a heat stable, waterproof white paper designated as P-350 which is available from Schoeller Technical Paper Sales, Inc. of Pulaski, New York. When the adhesive of barrier layer 12 is of the type that is thermally activated, the lamination process may be accomplished by inserting the substrate 30 and the inverted proofing sheet comprising layers represented by 12, 14, 16, 18 and 20 between a pair of nip rolls heated to 250° F. and passing the composite between these rolls at a linear speed of about 30 inches/minute.

FIG. 2 is intended to illustrate this inversion process and the subsequent lamination of the adhesive layer 12 to the paper substrate 30 with carrier sheet 20 and the associated release surface 18 removed. FIG. 2 further represents the mounted presensitive sheet of the present invention which has been exposed through a positive transparency. After such an exposure, binder and color layers 14b and 16b become solubilizable due the action of the actinic radiation on the diazo oxides whereas the non-exposed portions represented by 14a and 16a remain non-solubilized.

Because the light reacted coating comprising sections 16a and 14a are alkaline sensitive, a developing solution having a pH of between 12.8 to 13.1 will act to solubilize these areas for removal. The resulting structure is depicted in FIG. 3. The preferred developing solution is comprised of 1.5% sodium metasilicate and 0.10% wetting agent such as a sodium alkylnaphthalene sulfonate (e.g. Nekal NF sold by GAF Corporation of New York, N.Y.).

The remaining imaged structure after drying is then ready to receive a second presensitized proofing sheet of a different process color than was previously laminated to substrate 30. This is best represented by FIG. 4. The adhesive of the barrier layer 12 is shown in contact with imaged color layer 16a just prior to thermal lamination. It must be recognized that layers 14a and 16a represent only a few thousands of an inch in total thickness and that when layer 12 is laminated to the imaged section below, the result is essentially a planar surface.

The process of exposing and developing the succeeding layers with the appropriate color separation positives results in a four color replication of the original piece of graphic art.

A presensitized proofing sheets made in accordance with the present invention prior to storage may be sealed in a polyethylene packages so as to protect the release layer from moisture attack. The sheet may then be stored in sensitized condition and then used weeks or months later as successfully as immediately following manufacture.

Having thus described my invention generally it will be specifically illustrated with the aid of the following specific examples wherein all reaction chemical reactions occur at room temperature unless otherwise noted:

EXAMPLE 1

A carrier sheet of a 2-mil film of biaxially oriented polyethylene terephthalate polyester was first coated with a methyl ether of cellulose solution constituted as follows:

|  | Parts by weight |
| --- | --- |
| Methyl ether of cellulose (available as Methocel A-15 from Dow Chemical of Midland, Mich.) | 1.5 |
| n-propanol | 33.0 |
| water | 65.5 |

A dry coating weight of 50 to 70 mg/ft$_2$ provided a satisfactory release layer. To serve adequately as a release layer in causing a parting action between the temporary polyester support and the remaining structure, it was established that a release value of 4 grams per 2 lineal inch appeared to be an acceptable lower limit as measured by TAPPI Standards and a workable maximum value of 50 grams per 2 lineal inches. This release layer was then dried and a coating solution for the color layer was prepared by first preparing a urethane reaction product, as follows:

|  | % weight | % solid |
| --- | --- | --- |
| Novalak type phenolic resin (Resinox RS 7280 available from Monsanto Co. of St. Louis, Mo.) | 26.5 | 92.25 |
| Diisocyanate (D.D.I. 1410 available from General Mills of Minneapolis, Minn.) | 1.4 | 7.38 |
| Triethylene diamine (T.E.D.A.) | 0.1 | 0.37 |
| Methyl ethyl ketone | 72.0 | — |

After mixing for approximately 18 to 20 hours at room temperature, the urethane reacted product produced a reading of 10–11 cps. when measured on a Brookfield Viscometer with a #1 spindle and a speed of 60.

This urethane reaction product solution was then used to prepare the millbase containing the colored pigments, chosen so that they bear a close correlation to the pigment colors used in printing inks.

| Millbase Preparation | % Weight | % Solids |
| --- | --- | --- |
| Reacted urethane solution | 86.40 | 64.1 |
| Polyvinyl butyral (Butvar B-76, Monsanto) | 2.45 | 6.5 |
| Monastral Blue BT-284 D | 11.15 | 29.4 |

The procedure followed in combining the various components of the millbase includes first dissolving the polyvinyl butyral in the reacted urethane solution. The Monastral blue pigment was then added to the mixture which was then sand milled as needed to give a very fine grind. To this milled base was mixed an amount of diazo oxide (naphtoquinone-(1,2)-diazido-(2)-5-sulfo-acid ester of 4-tertiarybutylphenol) equal to 25% of the amount of urethane dry solids content. The color layer was then coated on the previously prepared carrier sheet using a #6 meyer bar diluting with MEK as required to obtain a 1.25 ROD (Reflection Optical density) reading using a Wratten ® R-25 filter (MacBeth TR-524 Dens).

A binder layer solution was prepared having as its composition:

|  | % Weight |
| --- | --- |
| Novalak type phenolic resin (Resinox RS 7280 available from Monsanto Co. of St. Louis, Mo.) | 1.27 |
| Diazo oxide (naphtoquinone-(1,2)-diazido-(2)-5-sulfo-acid ester of 4-tertiarybutyl-phenol) | 0.18 |
| Isopropanol | 98.5 |

The binder layer was then coated on the previously applied color layer by means of a #22 meyer bar to a coating weight of between 20 to 30 mg/ft$^2$.

A barrier layer was prepared comprising:

|  | % Weight |
| --- | --- |
| Styrene-butadiene copolymer (Pliolite-S5A, Goodyear) | 8.57 |
| Toluene | 91.43 |

This solution was applied to the previously coated binder layer at a coating weight of 500 mg/sq.ft. using a #36 meyer bar.

In the foregoing example a cyan color proofing sheet was described. Magenta, yellow and black presensitized proofing sheets may be prepared by selecting other pigment for incorporation into the color layer. The following are a few of the many pigments known to the art (C.I. meaning color index):

Blues—pigment blue 15 (C.I. 74160)
Wat. Red.—pigment red 48 (C.I. 15865)
Yellow—D-2840—pigment yellow 17 (C.I. 21105)
Quindo Mag.—RV-6803—pigment red 122 (C.I. 73915)
Alkali Resistant Red RT-539D—pigment red 23 (C.I. 12355)
Benzidene Yellow 4T-564D—pigment yellow 14 (C.I. 21095)
Monastral Green GT761-D—pigment green 7 (C.I. 74260)

One skilled in the art will appreciate the necessity of adjusting the various components of the color layer so as to obtain the desired exposure time with each pigment system. Because lower amounts of diazo oxide give shorter exposure times to actinic radiation, a workable diazo oxide range of from 17 to 33% of the reacted urethane has been found to be acceptable. For the yellow, cyan and black pigmented coating solutions, in one instance, an amount of diazo oxide equal to 25% of the reacted urethane was chosen, whereas the magenta coating solution required 33% diazo oxide.

EXAMPLE 2

A structure in Example 1 was prepared. An adhesive layer of a colorless pressure-sensitive adhesive (e.g. as disclosed in Ulrich U.S. Pat. No. Re. 24,906, granted Dec. 13, 1960) was coated on the surface of the barrier layer at a dry coating weight of 200 mg/ft$^2$. Following drying, a protective liner of a silicone coated paper is placed against the adhesive to facilitate handling of the sheet and to protect the adhesive from dirt etc.

EXAMPLE 3

A structure having a carrier sheet and a color layer was made as outlined in Example 1. A binder layer was prepared by charging the following into a quart jar fitted with a stirrer (Note—each compound was dissolved before the addition of the subsequent compound):

| | |
|---|---|
| Ethylene Glycol Monomethyl ether (Methyl cellosolve available from Dow Chemical Co.) | 600 grams |
| Novalak type phenolic resin (Resinox RS 7280 available from Monsanto Co. of St. Louis, Mo.) | 200 grams |
| 2 diazo-1-naphthol-5-sulfonyl Chloride (available from Molecular Rearrangement Inc. of Andover, New Jersey) | 28.4 grams |
| NaHCO$_3$ (available from Mallinchrodt Chemical Co. of St. Louis, Mo.) | 16.1 grams |

The above was stirred at 37° C. for 2 hours. It was then added to 38 lbs of 2% by weight H$_2$SO$_4$ in water, with rapid stirring, at an addition rate of 30 grams per minute.

The resulting precipitate was filtered and washed until the wash water was free of acid as measured by pH. The solid collected was then dried at room temperature with moderate air movement to remove the water as determined by the attainment of constant weight. The percent yield averaged 90%.

To prepare the binder coating solution 1.5 grams of the above dried solid was dissolved in 98.5 grams of isopropanol. This was then applied to the color coating as described in Example 1. A barrier layer was prepared and applied to the surface of this binder in similar manner as that of Example 1.

The lower limit on a mole ratio basis has been found to be approximately 5.5 moles of the phenolic resin per mole of pendent diazo oxide. The upper limit has been found to be approximately 2 moles of pendent diazo oxide per mole of the phenolic resin.

What is claimed is:

1. A presensitized color proofing sheet comprising
   a carrier sheet having a smooth release surface;
   a color coating of a diazo oxide and a pigmented resin compound in clinging engagement with but not adhesively bonded to said release surface of said carrier sheet;
   a binder layer comprising a mixture or reaction product of a resin and a diazo oxide bonded to the surface of said color coating; said binder layer being free of color pigment; and said color coating and said binder layer being solubilizable in a solvent developing medium upon exposure to actinic radiation but not solubilizable in the developing medium prior to exposure to actinic radiation; and
   a clear barrier layer firmly attached to said binder layer, said barrier layer being insoluble in said solvent development medium.

2. The presensitized sheet of claim 1 wherein said barrier layer is comprised of a heat activated adhesive.

3. The presensitized sheet of claim 2 wherein pressure-sensitive adhesive is applied to the previously applied heat activated adhesive.

4. The presensitized sheet of claim 2 wherein a release liner is attached to said barrier layer.

5. A method for obtaining a multicolored color proofing sheet image on one substrate comprising
   (a) bonding the barrier layer of a first presensitized sheet of claim 1 to a substrate;
   (b) removing said carrier sheet;
   (c) exposing said presensitized sheet through a color separation positive corresponding to the pigment of said color coating to actinic radiation whereby the exposed diazo oxide and resin mixture of said binder layer and said color coating is rendered soluble in an alkaline solvent developing medium to create a latent image;
   (d) developing said image with an alkaline solvent developing medium whereby exposed diazo oxide and resin mixture in said binder layer and associated color coating is removed and unexposed diazo oxide and resin in said binder layer and color coating remains;
   (e) bonding the barrier layer of an additional presensitized sheet as described in claim 1 having a different color pigment in said color coating to the developed first presensitized sheet;
   (f) repeating steps (b)-(d) with a subsequent separation positive being in register with said developed first presensitized sheet; and
   (g) repeating steps (e) and (b)-(d) in that order with additional presensitized sheets as described in claim 1, each of said presensitized sheets being of a different color, whereby there is provided said multi-colored proofing sheet on one substrate.

* * * * *